US011229952B2

(12) United States Patent
Bui

(10) Patent No.: US 11,229,952 B2
(45) Date of Patent: Jan. 25, 2022

(54) SYSTEM AND METHOD FOR FORMING PART FROM RAPIDLY MANUFACTURED ARTICLE

(71) Applicant: HONEYWELL INTERNATIONAL INC., Morris Plains, NJ (US)

(72) Inventor: Tho Xuan Bui, Phoenix, AZ (US)

(73) Assignee: HONEYWELL INTERNATIONAL INC., Charlotte, NC (US)

(*) Notice: Subject to any disclaimer, the term of this patent is extended or adjusted under 35 U.S.C. 154(b) by 102 days.

(21) Appl. No.: 16/105,645

(22) Filed: Aug. 20, 2018

(65) Prior Publication Data
US 2020/0055117 A1 Feb. 20, 2020

(51) Int. Cl.
B22F 10/10 (2021.01)
B33Y 10/00 (2015.01)
(Continued)

(52) U.S. Cl.
CPC .......... B22F 10/10 (2021.01); B22D 19/0072 (2013.01); B22D 25/02 (2013.01); B33Y 10/00 (2014.12); B33Y 30/00 (2014.12)

(58) Field of Classification Search
CPC .. B22F 3/008; B22F 5/04; B22F 3/225; B22F 2998/10; B22F 5/007; B22F 2007/066; B22F 3/1055; B22F 3/24; B22F 5/009; B33Y 10/00; B33Y 30/00; B33Y 80/00; B22D 23/06; B22D 27/045;
(Continued)

(56) References Cited

U.S. PATENT DOCUMENTS 6,932,865 B2   8/2005  Brice
9,364,888 B2   6/2016  McBrien et al.
(Continued)

FOREIGN PATENT DOCUMENTS

EP   2792771 A1   10/2014
EP   3281730 A1    2/2018
WO   2015112583 A1  7/2015

OTHER PUBLICATIONS

Iida, Takamichi Guthrie, Roderick I. L.. (2015). Thermophysical Properties of Metallic Liquids, vol. 2—Predictive Models—17.1 Melting and Boiling Points. (pp. 497-498). Oxford University Press. (Year: 2015).*

(Continued)

Primary Examiner — Rebecca Janssen
(74) Attorney, Agent, or Firm — Lorenz & Kopf, LLP

(57) ABSTRACT

A manufacturing method includes providing a material that includes a plurality of particles and a binder that is uncured. The method also includes forming a first article from the material including curing the binder to bind a collection of the particles together into the first article. Furthermore, the method includes encasing at least a portion of the first article with an outer member. The outer member defines an internal cavity that corresponds to the first article. Additionally, the method includes heating the outer member and the first article to melt the collection of particles into a molten mass within the internal cavity of the outer member. Moreover, the method includes solidifying the molten mass within the outer member to form a second article. The second article corresponds to at least a portion of the internal cavity of the outer member.

18 Claims, 14 Drawing Sheets

(51) Int. Cl.
*B22D 19/00* (2006.01)
*B22D 25/02* (2006.01)
*B33Y 30/00* (2015.01)

(58) Field of Classification Search
CPC ... B22D 19/0072; B22D 25/02; C30B 11/002; C30B 29/607; C30B 29/52; C30B 11/00
See application file for complete search history.

(56) References Cited

U.S. PATENT DOCUMENTS

| | | | |
|---|---|---|---|
| 9,435,211 | B2 | 9/2016 | Xu |
| 9,604,280 | B2 | 3/2017 | Xu |
| 2003/0062145 | A1 | 4/2003 | Frasier et al. |
| 2009/0007724 | A1* | 1/2009 | Liu .................. B22F 10/10 75/230 |
| 2011/0135952 | A1 | 6/2011 | Morris et al. |
| 2011/0236699 | A1* | 9/2011 | Heikkila ............ A01K 85/00 428/457 |
| 2012/0213659 | A1 | 8/2012 | Bayer et al. |
| 2013/0280091 | A1 | 10/2013 | Propheter-Hinckley et al. |
| 2014/0053956 | A1 | 2/2014 | Etter et al. |
| 2014/0163717 | A1 | 6/2014 | Das et al. |
| 2014/0169981 | A1 | 6/2014 | Bales et al. |
| 2014/0314581 | A1 | 10/2014 | McBrien et al. |
| 2015/0266285 | A1 | 9/2015 | James et al. |
| 2015/0321250 | A1 | 11/2015 | Xu |
| 2015/0322799 | A1 | 11/2015 | Xu |
| 2016/0059302 | A1 | 3/2016 | McBrien et al. |
| 2016/0061044 | A1 | 3/2016 | McBrien et al. |
| 2016/0158843 | A1* | 6/2016 | Yolton .................. B22F 3/15 419/6 |
| 2016/0319677 | A1 | 11/2016 | McBrien et al. |
| 2017/0284208 | A1* | 10/2017 | Xu .................... B22C 7/02 |
| 2018/0036796 | A1 | 2/2018 | Mittendorf et al. |
| 2020/0062877 | A1* | 2/2020 | Knopf ................ C08F 222/40 |

OTHER PUBLICATIONS

Wei Gao et al., "The status, challenges, and future of additive manufacturing in engineering," Computer Aided Design, Dec. 2015, pp. 65-89, vol. 69, XP055538512, GB.

* cited by examiner

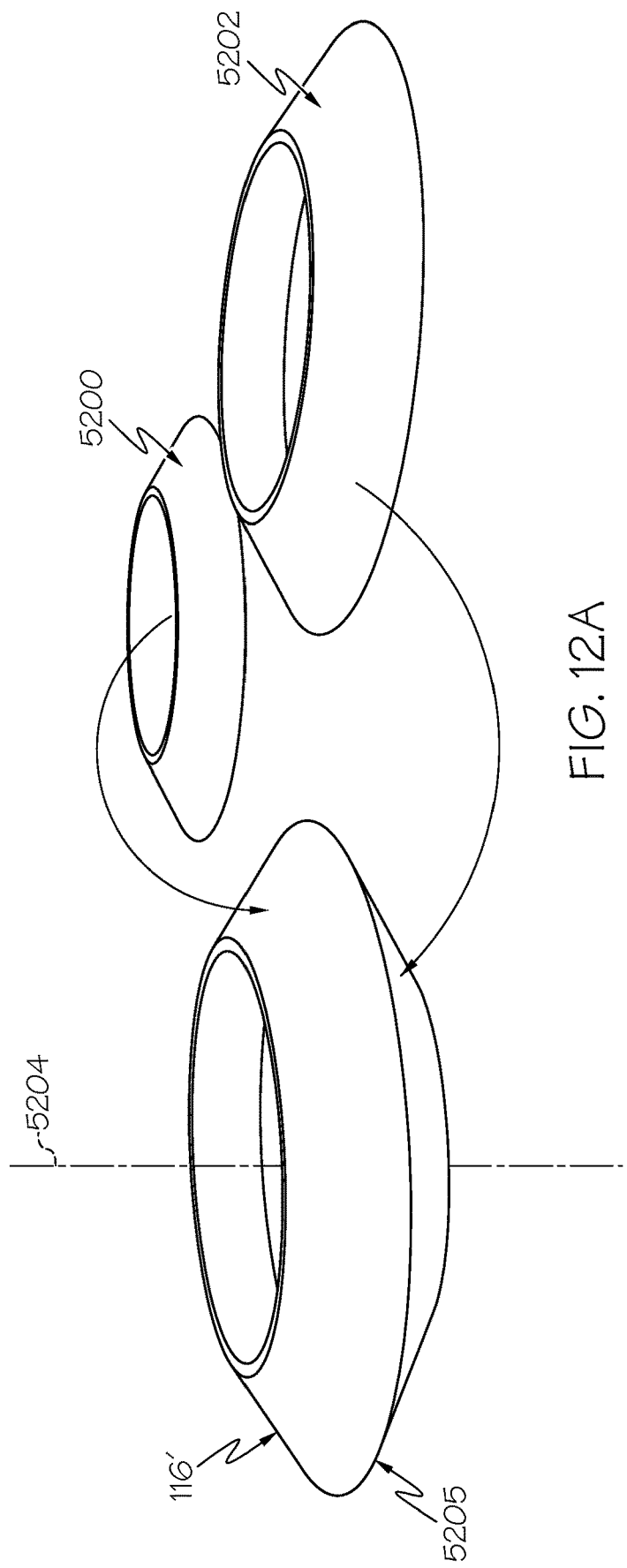

SYSTEM AND METHOD FOR FORMING PART FROM RAPIDLY MANUFACTURED ARTICLE

TECHNICAL FIELD

The present disclosure generally relates to manufacturing methods, systems, and parts formed therewith and, more particularly, relates to a system and method for forming a part from a rapidly manufactured article.

BACKGROUND

Parts may be manufactured using a variety of methods. Certain characteristics of the part may be affected by the manufacturing method used to make the part. For example, the geometry of the part, the surface roughness, the material characteristics, and/or other features may be dependent on the manufacturing methods that are employed.

Additionally, different manufacturing methods present certain challenges and limitations. Some methods may be more energy efficient than others. Some methods may be more labor intensive than others, may require expensive machinery, etc. These considerations should be taken into account when deciding how to manufacture parts.

There remains a need for improved manufacturing methods that have high efficiency. There also remains a need for methods that can be used to make complex parts accurately and repeatably. Other desirable features and characteristics of the present disclosure will become apparent from the subsequent detailed description and the appended claims, taken in conjunction with the accompanying drawings and the foregoing technical field and background.

BRIEF SUMMARY

In one embodiment, a method of manufacturing a part is disclosed. The method includes providing a material that includes a plurality of particles and a binder that is uncured. The method also includes forming a first article from the material including curing the binder to bind a collection of the particles together into the first article. Furthermore, the method includes encasing at least a portion of the first article with an outer member. The outer member defines an internal cavity that corresponds to the first article. Additionally, the method includes heating the outer member and the first article to melt the collection of particles into a molten mass within the internal cavity of the outer member. Moreover, the method includes solidifying the molten mass within the outer member to form a second article. The second article corresponds to at least a portion of the internal cavity of the outer member.

In another aspect, a method of manufacturing a part includes providing a particulated material and forming a first article from the particulated material. The first article defines an exterior and defines a first internal aperture. The method also includes providing a flowing core material within the first internal aperture. Furthermore, the method includes converting the flowing core material to a solid core within the first internal aperture. Still further, the method includes encasing the first article and the solid core with an outer member. The outer member defines an internal cavity surface that corresponds to at least part of the exterior of the first article. Additionally, the method includes heating the outer member, the first article, and the solid core to melt the first article into a molten mass within the internal cavity of the outer member. Moreover, the method includes re-solidifying the molten mass within the outer member and about the solid core to form a second article. An outer surface of the second article corresponds to the internal cavity surface of the outer member. The second article includes a second internal aperture corresponding to the solid core.

BRIEF DESCRIPTION OF THE DRAWINGS

The present disclosure will hereinafter be described in conjunction with the following drawing figures, wherein like numerals denote like elements, and wherein:

FIGS. 12A and 12B are schematic views of assembled first articles formed according to the manufacturing methods of the present disclosure.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Figure 1A:
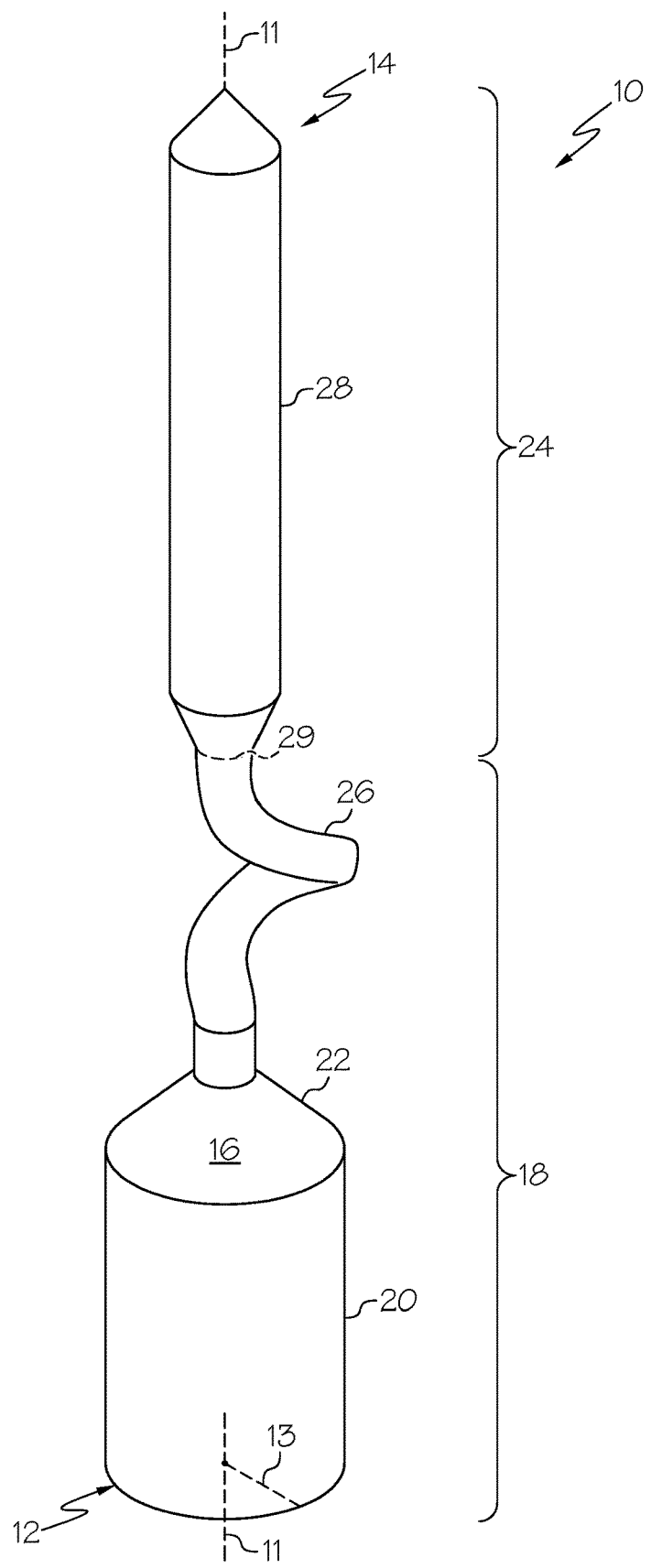
FIG. 1A is a perspective view of an example part formed according to a manufacturing method of the present disclosure.

Referring initially to FIG. 1A, a part 10 is shown according to exemplary embodiments of the present disclosure. The part 10 may be formed using the system 100 represented schematically in FIG. 2 and according to the manufacturing method 1000 represented in FIG. 3.

As will be discussed, the part 10 may be formed in a specific and controlled manner. The material used to make the part may be particularly configured for increasing manufacturability, for increasing manufacturing efficiency, etc. as will be discussed. Rapid manufacturing techniques (i.e., rapid prototyping techniques, etc.) may be used to form a first article that corresponds to the part 10. The materials used may include a metallic material and a binder that is used to bind particles of the metal together. A relatively low density part may be made, an outer member may be formed to encase the low density part, and the low density part may be melted and re-solidified within the outer member. As will be described, this improves manufacturing efficiency substantially.

Furthermore, the methods of method 1000 of the present disclosure may include forming an internal aperture within the part 10. For example, the aperture may be a passage, such as a cooling fluid passage that is extends through the part 10. The method 1000 may facilitate formation of the internal aperture to thereby increase manufacturing efficiency further.

Also, in some embodiments, the part 10 may be directionally solidified as will be discussed in detail below. Accordingly, the material structure of the part 10 may include relatively few crystals and/or relatively few grain boundaries. Specifically, in some embodiments, the part 10 may have a single-crystal grain structure. As will be discussed, the part 10 may be formed in an efficient and effective manner.

It will be appreciated that the terms "directionally solidified," "directional solidification," and other related terms are used generally herein to include solidification that occurs in a predetermined and controlled manner, and substantially along a predetermined direction. Thus, directional solidification methods of the present disclosure may be used to form a part with single-crystal grain structure in some embodiments. In other embodiments, directional solidification methods of the present disclosure may be used to form a part with multiple-crystal grain structure.

It will also be appreciated that the manufacturing system 100 and/or the manufacturing method 1000 of the present disclosure may be used to form parts 10 that are formed in other ways. The part 10 may be solidified in a more uncontrolled manner such that the part 10 may have a relatively high number of crystals and grain boundaries. In other words, directional solidification may be an optional feature of the present disclosure.

Referring now to FIG. 1A, specific features of the part 10 will be discussed in greater detail. The part 10 may be a one-piece, unitary body. The part 10 may be substantially solid (i.e., not hollow). In additional embodiments, the part 10 may include one or more internal channels, flow passageways with an inlet and an outlet, enclosed pockets, cavities, or other aperture(s). The part 10 may define a longitudinal axis 11 and a radial axis 13. The part 10 may include a first end 12 and a second end 14, which are spaced apart relative to the longitudinal axis 11. The part 10 may also include an outer periphery 16 (i.e., outer surface).

As shown, the part 10 may include a first body portion 18, a second body portion 24, which are joined end-to-end at an imaginary parting plane 29. The first body portion 18 may include a cylindrical portion 20 (i.e., a "base"), a frusto-conic portion 22, and a helical member 26 (i.e., a "pigtail" or "grain selector"). At least part of the first body portion 18 may also be referred to as a sprue portion of the part 10. The cylindrical portion 20 and frusto-conic portion 22 may be substantially centered about the longitudinal axis 11. The frusto-conic portion 22 may be disposed on an end of the cylindrical portion 20, opposite the first end 12 of the part 10. The helical member 26 may extend helically about the longitudinal axis 11 as it extends away from the frusto-conic portion 22. The second body portion 24 may include a cylindrical portion 28 that is centered on the longitudinal axis 11. The second body portion 24 may also be tapered at the second end 14 and may be referred to as a "slag" end.

Figure 2:
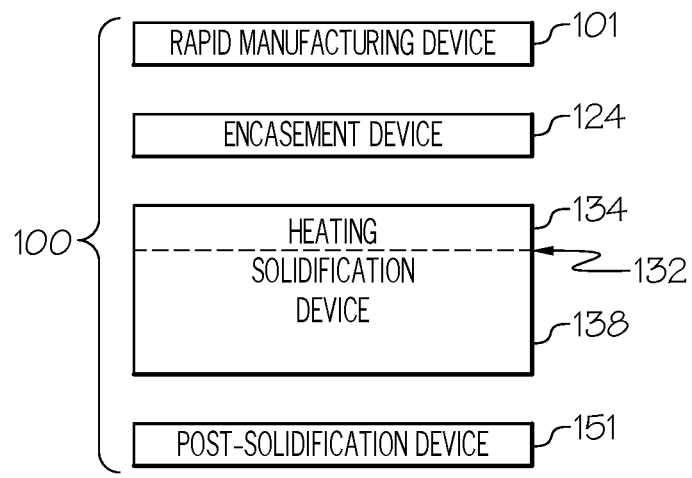
FIG. 2 is a functional block diagram of a manufacturing system configured to form the part of FIG. 1A and/or FIG. 1B.
Figure 3:
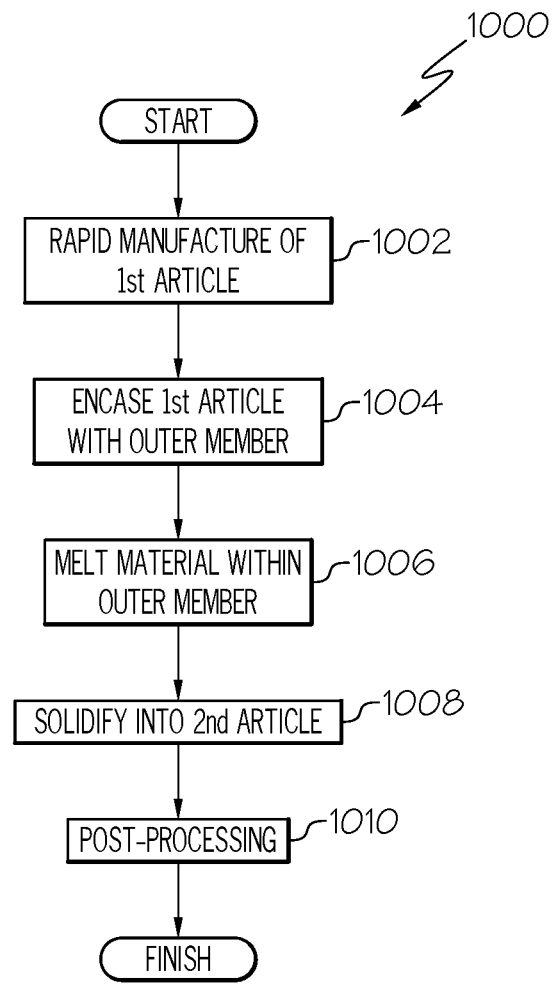
FIG. 3 is a flowchart illustrating a method of manufacturing the part of FIG. 1A and FIG. 1B.

It will be appreciated that the part 10 shown in FIG. 1A is merely an example of a variety of parts that may be manufactured using the system 100 of FIG. 2 and/or the method 1000 of FIG. 3. Thus, the shape, dimensions, or other features of the part 10 may differ from the embodiment shown in FIG. 1A without departing from the scope of the present disclosure.

Figure 1B:
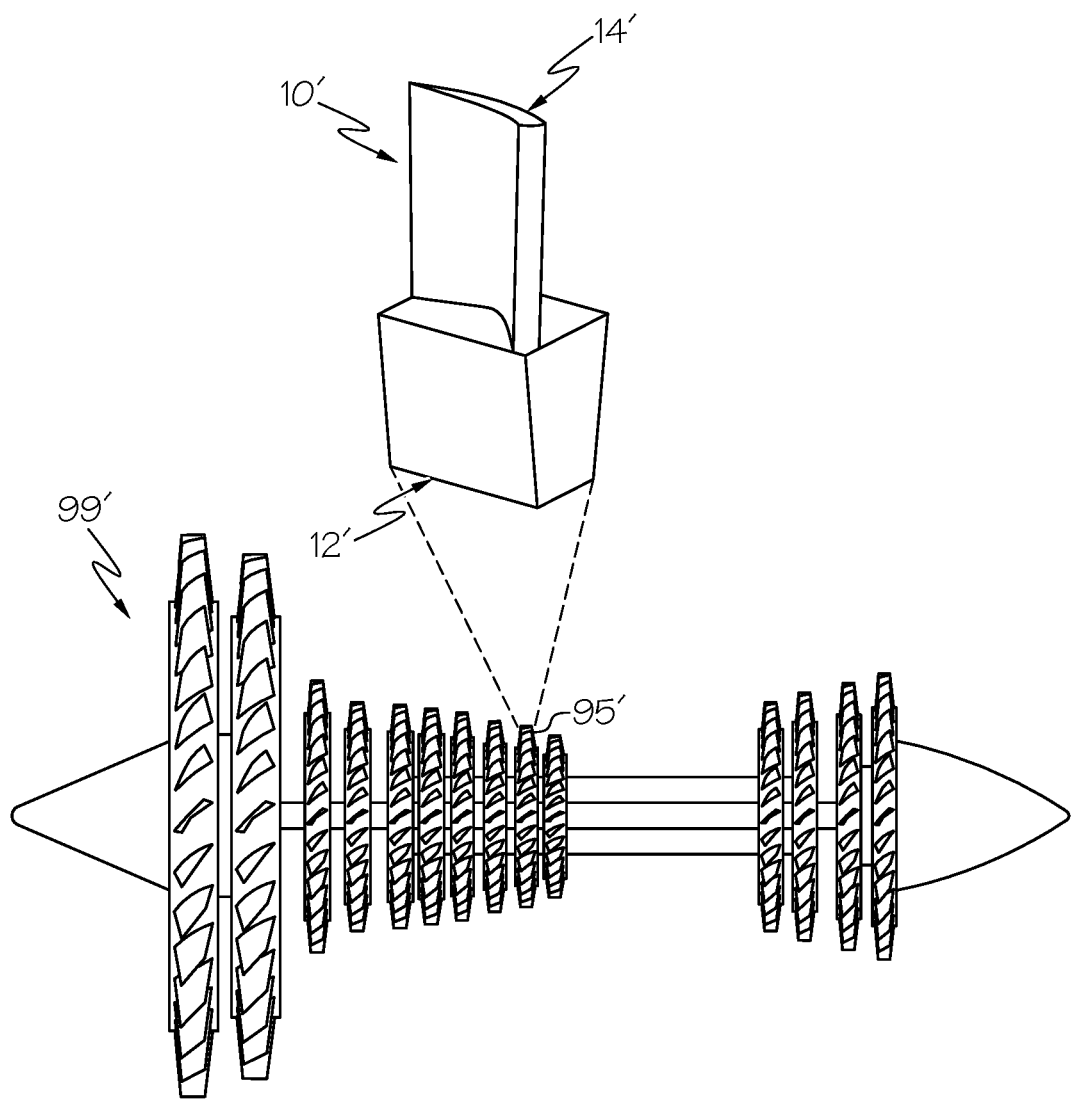
FIG. 1B is a schematic perspective view of the part according to additional embodiments of the present disclosure.

The shape, dimensions, etc. of the part may be specifically designed according to its use. For example, as shown in FIG. 1B, the part 10' is shown according to additional embodiments. The part 10' is configured for use within a gas-turbine engine 99', such as an engine of an aircraft. Accordingly, the first end 12' may be configured for attachment to a rotor 95' of the engine 99', and the second end 14' may be contoured for directing gas flow past the rotor 95' during operation of the engine 99'.

The part 10, 10' may be formed and shaped for other uses as well without departing from the scope of the present disclosure. For example, the part 10, 10' may be formed and shaped for use as a nozzle or other component of the gas-turbine engine 99' or for other uses.

The part 10, 10' may also include features specifically for use during manufacturing. For example, the part 10, 10' may include a sprue, a chiller plate, or other features used in casting or casting-type operations. Several manufacturing techniques are discussed herein as example embodiments of the present disclosure, such as binder jet printing, metal stereographic lithography (MSL), metal injection molding (MIM), compression bonding, three-dimensional printing, direct metal laser sintering (DMLS), and selective laser melting (SLM). However, other techniques may be employed without departing from the scope of the present disclosure.

The part 10, 10' may be made out of any suitable material. For example, in some embodiments, the part 10, 10' may be made out of a material that is suitable for rapid manufacturing (i.e., "rapid prototyping"). In some embodiments, the material may be suited for "tool-less" casting techniques that will be discussed below.

Also, the material of the part 10, 10' may have certain thermal characteristics, such as a predetermined melting point. If the material is heated above this point, the material melts and becomes liquid, flowable, molten, etc. If the material is cooled below this point, the material solidifies and becomes solid, hardens, etc. In some embodiments, the material may be specifically configured for being melted, then solidified, re-melted, and re-solidified in a sequence.

Furthermore, the material may be configured for solidification along a predetermined solidification path. For example, the part 10, 10' may be formed from material useful in a directional solidification process.

Once solidified, the part 10, 10' may have a material structure with a relatively low number of crystals and/or internal grain boundaries. For example, in some embodiments, the majority of the part 10, 10' may have a single-crystal grain structure. In other words, all or substantially all of the part 10, 10' may be made from a single crystal of material. In addition, the part 10, 10' may have a material structure with relatively few voids or cavities. Also, any voids or cavities that are included in the part 10, 10' may be relatively small.

In the embodiment of FIG. 1A, the majority of the second body portion 24 may have single-crystal grain structure. The first body portion 18 and a slag portion at the second end 14 may be removed from the second body portion 24, leaving a single-crystal grain structure part. Although not shown, the part 10' of FIG. 1B may be formed along with body portions that are removed, such that the part 10' of FIG. 1B remains and includes single-crystal grain structure.

The following will provide further details of the present disclosure in reference to the part 10 of FIG. 1A. However, it will be appreciated that the following may apply as well to the part 10' of FIG. 1B or to another part without departing from the scope of the present disclosure.

Referring now to FIG. 2, the system 100 for manufacturing the part 10 will be discussed in greater detail according to exemplary embodiments. Generally, the system 100 may include a rapid manufacturing device 101, an encasement device 124, a heating/solidification device 132, and a post-solidification device 151. As shown in FIG. 2, the heating/solidification device 132 may be embodied by a single machine, which performs both heating and solidification functions. However, in other embodiments, heating may be performed by a single machine, and solidification may be performed by a different machine. The system 100 may be employed for performing the manufacturing method 1000 illustrated in FIG. 3.

The method 1000 may begin at 1002, wherein the rapid manufacturing device 101 is used. The rapid manufacturing device 101 may be one of a variety of devices that fall within the scope of the present disclosure. The rapid manufacturing device 101 may be an additive manufacturing device (FIGS. 4A and 4D) or a non-additive manufacturing device (FIGS. 4B and 4C) as explained in greater detail below. The rapid manufacturing device 101 may also be a tool-less manufacturing device (FIGS. 4A and 4D) or a tooled manufacturing device (FIGS. 4B and 4C) as discussed below. In these embodiments, the rapid manufacturing device 101 may decrease manufacturing time, for example, in comparison with traditional investment casting operations.

Embodiments in which the rapid manufacturing device 101 is an additive manufacturing device will be discussed initially. In these embodiments, the rapid manufacturing device 101 may be a three-dimensional (3-D) printer, a binder jet printer, a metal stereographic lithography (MSL) device, etc. In these embodiments, an article may be sequentially formed and built layer-by-layer over time. For example, the rapid manufacturing device 101 may sequentially deliver material and/or energy to predetermined points in space to produce the article. At 1002 of the method 1000, the article may be additively manufactured using any type of additive manufacturing process which utilizes layer-by-layer construction, including, but not limited to: binder jet printing; metal stereographic lithography (MSL); selective laser melting; direct metal deposition; direct metal laser sintering (DMLS); direct metal laser melting; electron beam melting; electron beam wire melting; micro-pen deposition in which liquid media is dispensed with precision at the pen tip and then cured; selective laser sintering in which a laser is used to sinter a powder media in precisely controlled locations; laser wire deposition in which a wire feedstock is melted by a laser and then deposited and solidified in precise locations to build the product; laser engineered net shaping; Direct Metal Electron Beam Fusion (DMEBF); and other powder consolidation techniques. In some embodiments, this or other portions of the method 1000 may occur according to the teachings of U.S. Patent Publication No. 2018/0036796, filed Aug. 8, 2016, the entire disclosure of which is incorporated herein by reference.

Figure 4A:
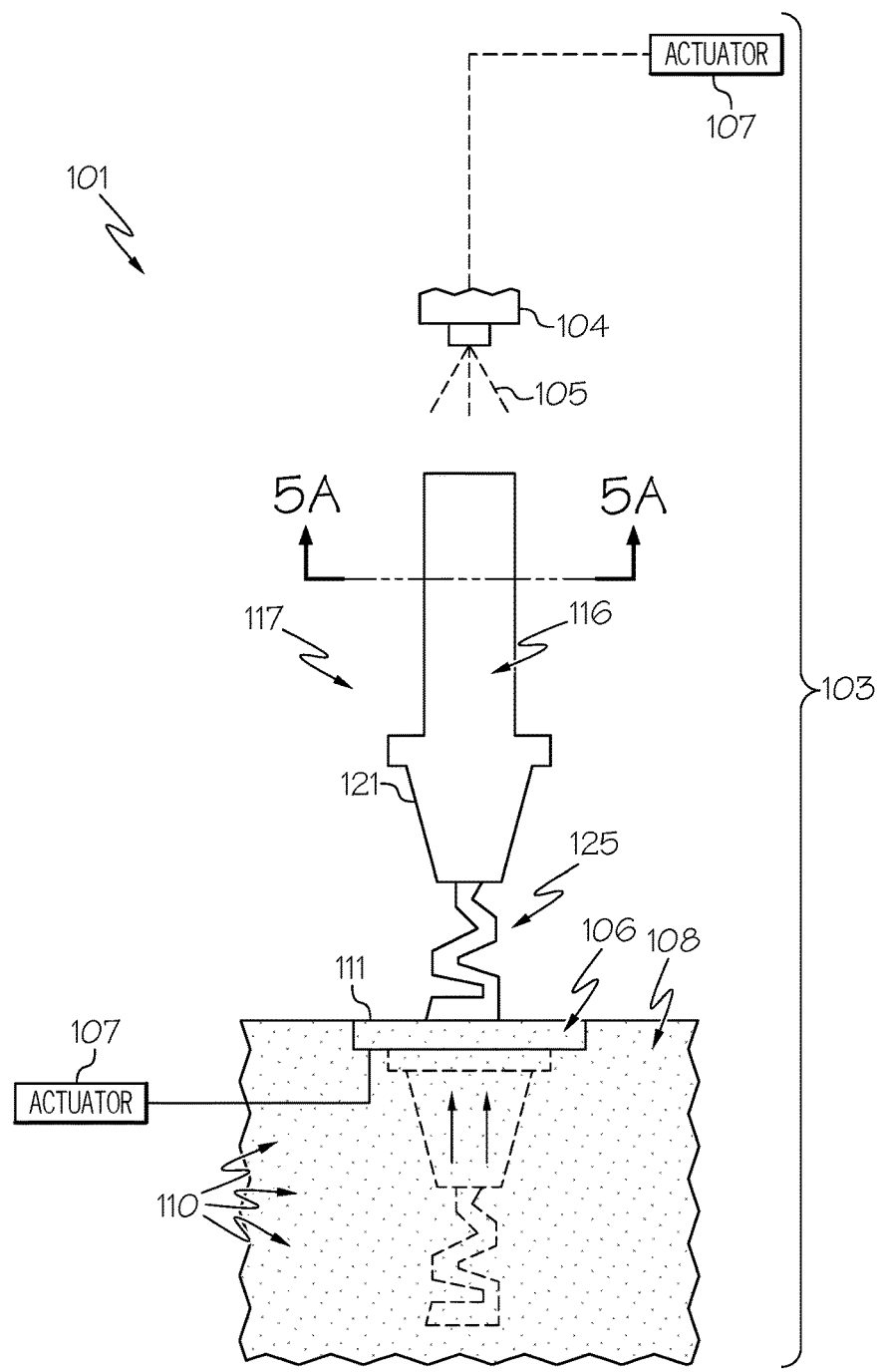
FIGS. 4A-4D are schematic illustrations of rapid manufacturing devices according to different embodiments of the present disclosure.

Referring to FIG. 4A, an example embodiment of the rapid manufacturing device 101 will be discussed. Specifically, the rapid manufacturing device 101 may comprise a binder jet manufacturing device 103. The device 103 may be used to additively manufacture and form a first article 116. The first article 116 may correspond substantially in shape, scale, and dimension to the part 10 discussed above and illustrated in FIG. 1A. Thus, the first article 116 of FIG. 4A may be formed to include a first portion 125 corresponding to the first body portion 18 of the part 10 of FIG. 1A. Likewise, the first article 116 of FIG. 4A may be formed to include a second portion 117 corresponding to the second body portion 24 of FIG. 1A. An outer surface 121 of the first article 116 may correspond to that of the part 10. Thus, the outer surface 121 may have at least one area that has complex curvature (i.e., three-dimensional contour).

Figure 6A:
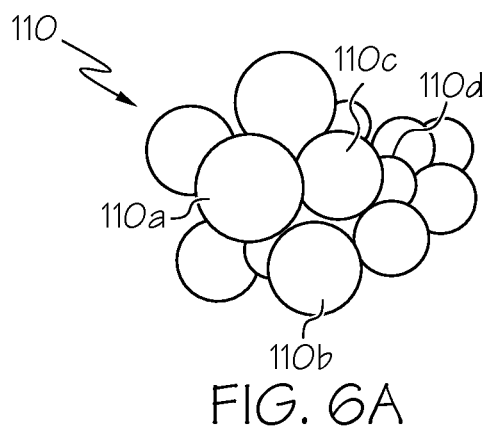
FIGS. 6A-6C is a schematic magnified view of materials used to form the first article of FIGS. 4A-4D.

The manufacturing device 103 of FIG. 4A may include a support bed 106 that supports a collection of material 108. In some embodiments, the collection of material 108 may be a particulate material. In other words, the material 108 may include a plurality of particles 110 (e.g., powder, particulate, etc.) as indicated in FIG. 4A and as shown in a magnified representation in FIG. 6A. As shown, the particles 110 may include substantially spherical particles 110a, 110b, 110c, 110d of various sizes. However, it will be appreciated that the particles 110 may be of any shape and size without departing from the scope of the present disclosure. The particles 110 may be metallic and may have single crystal grain structure in some embodiments. Additionally, in some embodiments, the particles 110 may be made from a metal alloy or super alloy. In one example, the particles 110 may be made from a nickel-based super alloy, an iron-based super alloy, a cobalt-based super alloy, or combinations thereof. For example, the particles 110 may be made from SC180, CMSX-4, or another single crystal alloy. In some embodiments, the particles 110 may be of a type that is considered "un-sinterable" or "un-weldable", such as MAR-M247, or Haynes 230. These materials may be susceptible to cracking, void formation as an article is formed; however, the methods 1000 of the present disclosure may include features for avoiding such features.

The manufacturing device 103 may also include a distributor 104. In some embodiments, the distributor 104 may be configured to emit and distribute a binder 105 toward predetermined areas of the support bed 106 in constructing the first article 116. The binder 105 emitted by the distributor 104 may be an uncured adhesive, resin, or other binder. Once cured, the binder 105 may be adhesively bind metal particles together.

The manufacturing device 103 may also include at least one actuator 107 that is configured to move the distributor 104 relative to the support bed 106 in a controlled manner. In some embodiments, the distributor 104 and/or the actuator(s) 107 may be in communication with a computerized device (not shown). The computerized device may include computerized memory (RAM or ROM) and a processor. The processor may send control signals to the distributor 104 and/or the actuator(s) 107 based on Computer Aided Design (CAD) data that is stored in the memory. The CAD data can correspond to the first article 116. Accordingly, the processor may control the distributor 104 and/or the actuator(s) 107 to form the first article 116.

Figure 6B:
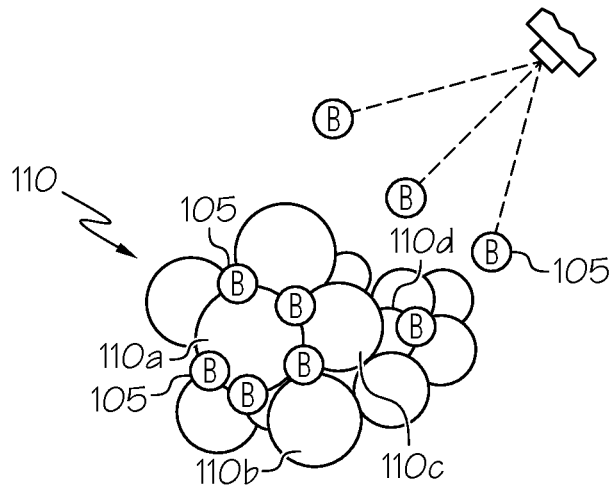
Figure 6C:
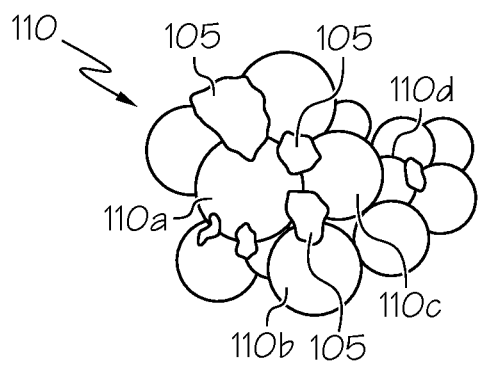

During operation of the manufacturing device 103, as shown in FIGS. 4A and 6B, the distributor 104 may selectively spray the binder 105 across predetermined areas of the material 108 on the bed 106. The actuator(s) 107 may actuate the distributor 104 relative to the bed 106 as it distributes the binder 105. The binder 105 may be uncured as it is distributed amongst the particles 110 of metal. Then, the binder 105 may be cured to adhesively bind the surrounding particles 110 together as represented in FIG. 6C. The binder 105 may cure, for example, due to exposure to air, exposure to low temperature, due to exposure to light, etc. The manufacturing device 103 may include a device that focuses airflow, cold temperature, or light toward the material 108 to control curing of the binder 105.

Once the binder 105 is cured, a relatively solid layer of bound particles 110 may be formed on the top surface of the bed 106. An agitator may agitate more loose particles 110 on the solid layer, and the distributor 104 may continue to spray the binder 105. The actuator 107 may selectively change elevation of the support bed 106 in some embodiments. The first article 116 may be formed layer by successive layer as the actuator 107 moves the support bed 106 until the first article 116 is completed.

As represented in FIG. 6C, the particles 110 may remain solid and independent from each other during rapid manufacture of the article 116 (i.e., 1002 of the method 1000). This is because the temperatures involved in forming the article 116 may be well below the melting point of the particles 110. The particles 110 need not melt or fuse together because the binder 105 holds them together instead (i.e., the particles 110 may remain "un-sintered" from each other). Accordingly, the rapid manufacture of the article 116 may be achieved in an energy-efficient manner.

Figure 5A:
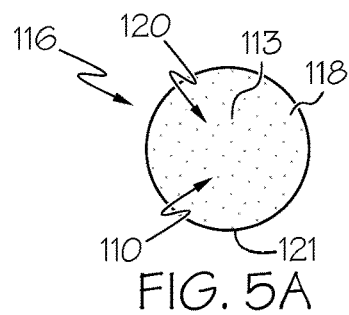
FIG. 5A is a cross section of a first article formed with the rapid manufacturing device of FIG. 4A, taken along the line 5A-5A of FIG. 4A.

As shown in the cross section of FIG. 5A, the article 116 may have a solid cross section. The majority of the particles 110 within the cross section may be bound together via the binder 105. There may be a relatively high degree of porosity in some embodiments due to spaces that remain between the bound particles 110. In some embodiments, approximately 2% or less of the article 116 may be made up by the binder 105, and the remaining percentage may be made up by the metallic particles 110.

Figure 4B:
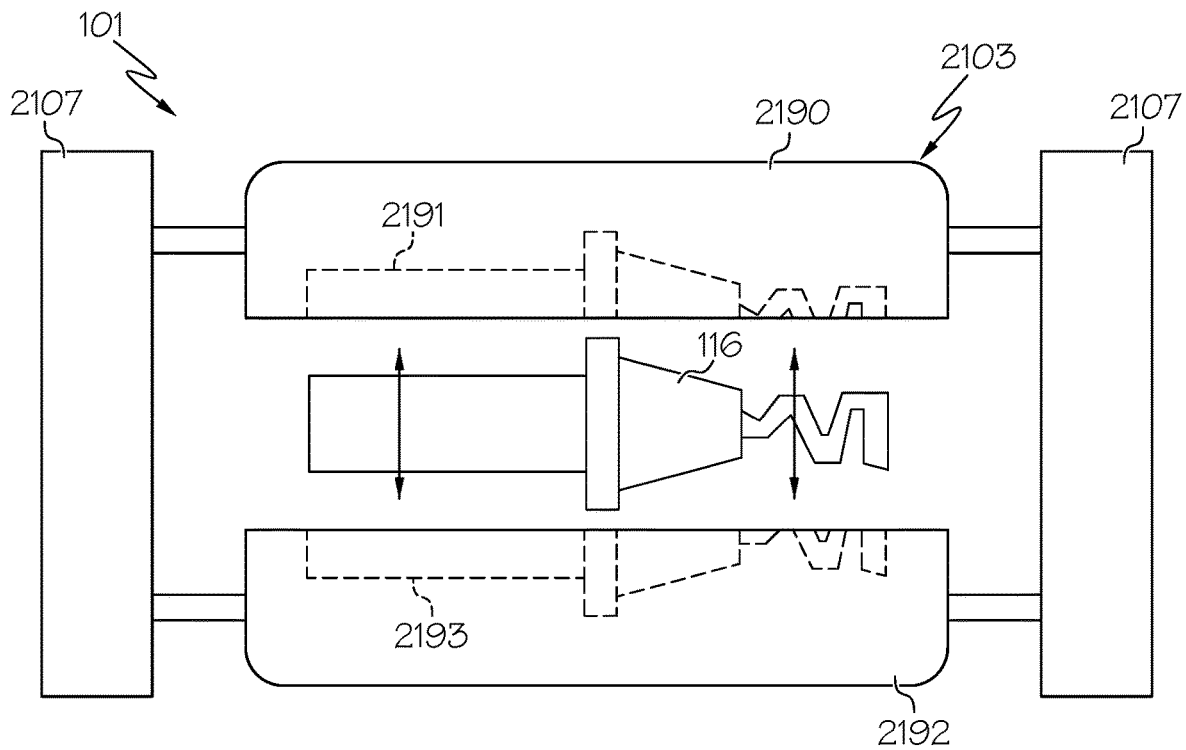

Referring to FIG. 4B, additional embodiments of the rapid manufacturing device 101 and additional embodiments of 1002 of the method 1000 are illustrated. The rapid manufacturing device 101 may comprise a compression bonding manufacturing device 2103 and may be used to form the first article 116 via a compression bonding process.

In some embodiments, the manufacturing device 2103 may include at least one die with a shaped surface that is used to shape a collection of the particles 110 and binder 105 (FIG. 6B). In some embodiments, the device 2103 may include a first die 2190 with a first shaped surface 2191 and a second die 2192 with a second shaped surface 2193. The first and second shaped surfaces 2191, 2193 may be shaped to correspond (inversely) to the article 116 in some embodiments. The manufacturing device 2103 may also include at least one actuator 2107 that is configured to move the first and/or second die 2190, 2192 relative to each other.

During operation of the manufacturing device 2103, a collection of the particles 110 and binder 105 (FIG. 6B) may be provided between the first shaped surface 2191 and the second shaped surface 2193. The actuators 2107 may move the first and second dies 2190, 2192 toward each other such that the first and second surfaces 2191, 2193 apply a compression load to the materials. In some embodiments, heat may be applied to the materials to soften and/or melt the binder 105 as the compression load is applied. Then, the binder 105 may be cured to bind the particles 110 together into the article 116 (FIG. 6C). Next, the article 116 may be removed from the manufacturing device 2103 for continuing the manufacturing method 1000 at 1004 (FIG. 3).

Although only two dies 2190, 2192 are shown in FIG. 4B, it will be appreciated that other embodiments may vary. For example, a series of different dies may be used to successively shape the material until the article 116 is formed.

Figure 4C:
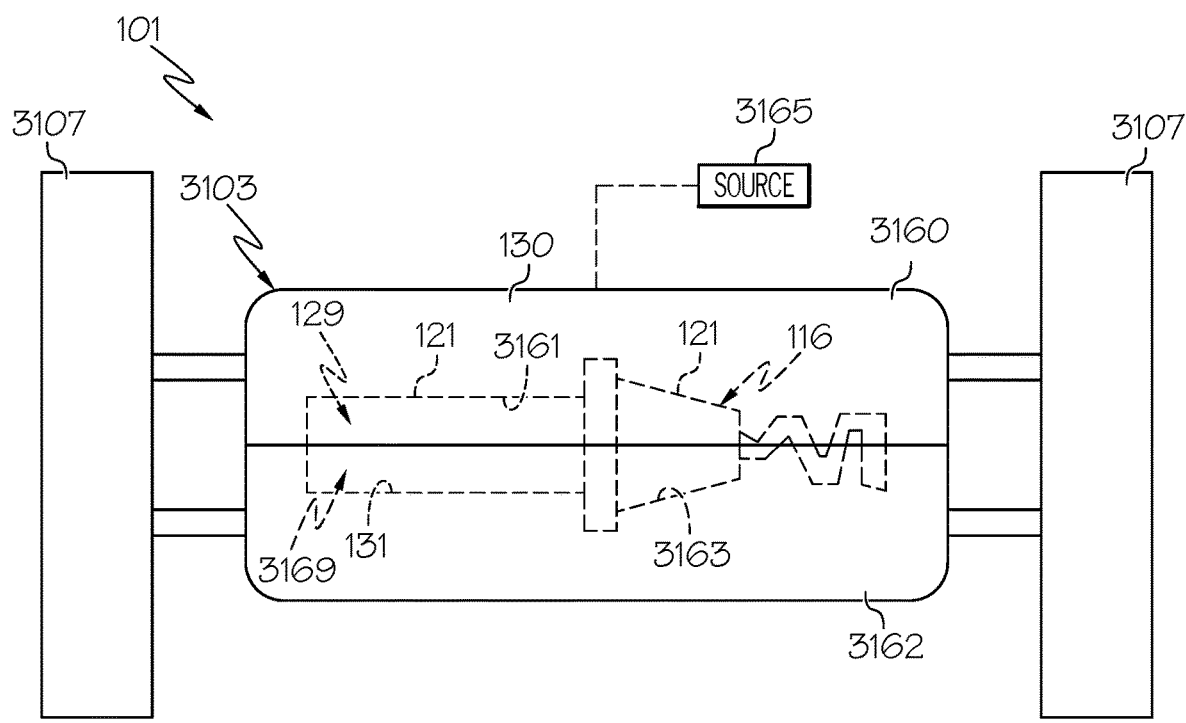

Referring now to FIG. 4C, additional embodiments of the rapid manufacturing device 101 and additional embodiments of 1002 of the method 1000 are illustrated. The rapid manufacturing device 101 may comprise a metal injection molding (MIM) device 3103 and may be used to form the first article 116 via a MIM-bonding process.

In some embodiments, the manufacturing device 3103 may include a first mold member 3160 with a first shaped surface 3161 and a second mold member 3162 with a second shaped surface 3163. The first and second shaped surfaces 3161, 3163 may be shaped to correspond (inversely) to the article 116 in some embodiments. The manufacturing device 3103 may also include at least one actuator 3107 that is configured to move the first and/or second mold members 3160, 3162 relative to each other. When positioned together, the first and second shaped surfaces 3161, 3163 may define at least part of a cavity 3169 that corresponds in shape (inversely) to the article 116.

During operation of the manufacturing device 3103, a collection of the particles 110 and binder 105 (FIG. 6B) may be provided from a bulk source 3165 within the cavity 3169. The collection of material may be provided with positive pressure to fill the cavity 3169 and form the article 116 according to the contours of the first shaped surface 3161, and the second shaped surface 3163. In some embodiments, heat may be applied to the materials within the cavity 3169 to soften and/or melt the binder 105. Then, the binder 105 may be cured (FIG. 6C) to bind the particles 110 together into the article 116. Next, the article 116 may be removed from the cavity 3169 for further processing within the method 1000.

Figure 4D:
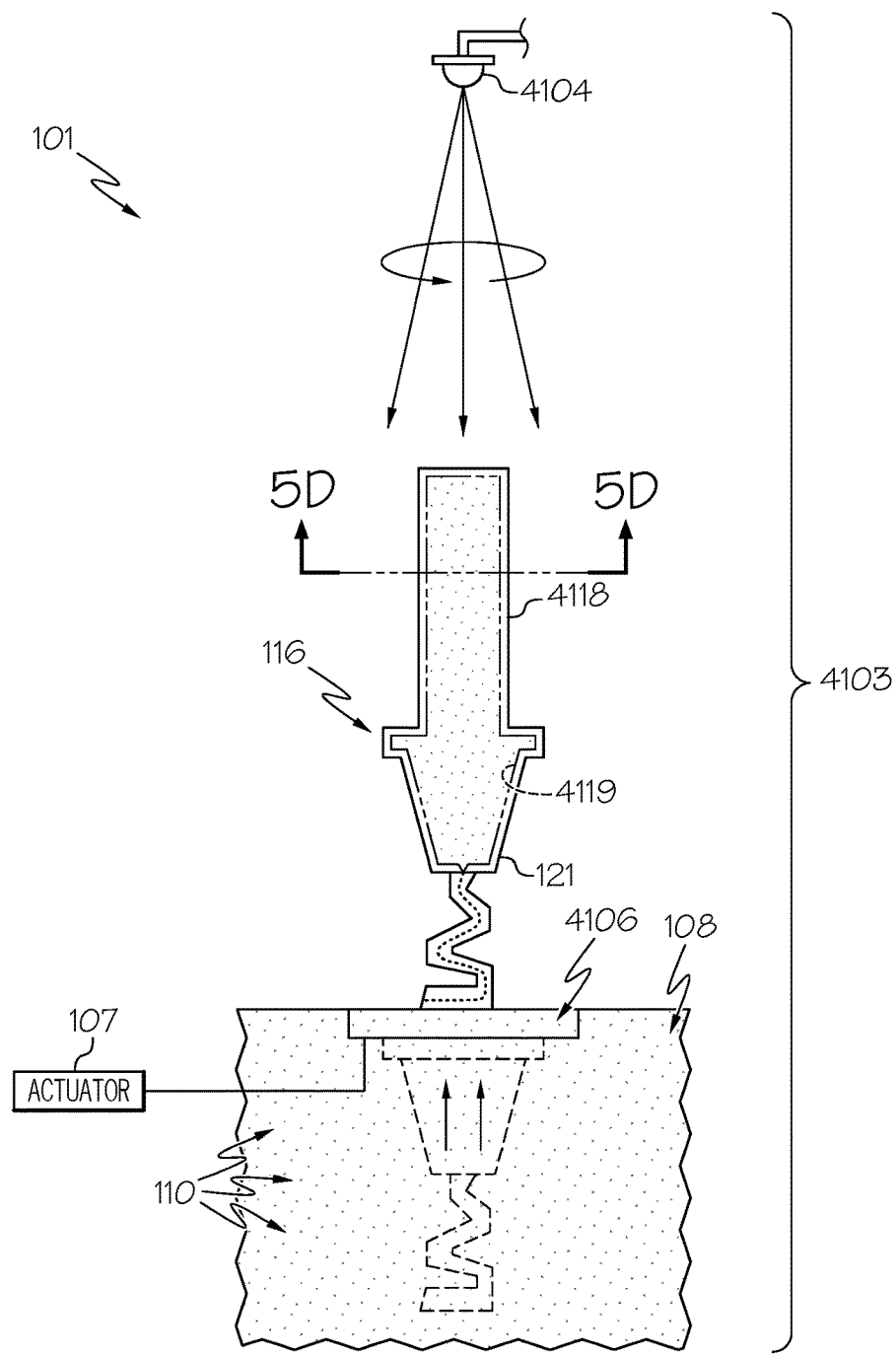

Referring now to FIG. 4D, additional embodiments of the rapid manufacturing device 101 and additional embodiments of 1002 of the method 1000 are illustrated. The rapid manufacturing device 101 may comprise a stereographic lithography device 4103 and may be used to form the first article via a stereographic lithography process.

In some embodiments, a bed 4106 may support a collection of uncured binder 105 and particles 110 (FIG. 6B). The binder 105 may be a monomer that is distributed with the metal particles 110 as represented in FIG. 6B.

The device 4103 may include an emitter 4104. The emitter 4104 may selectively emit a laser, an electron beam, or other energy toward the support bed 4106 to cure the monomer binder 105 and bind certain particles 110 together to form the article 116. Thus, the article 116 may be additively formed layer-by-layer until the article 116 is complete.

Figure 5D:
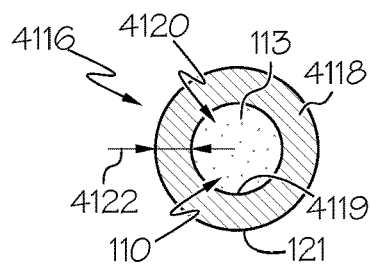
FIG. 5D is a cross section of a first article formed with the rapid manufacturing device of FIG. 4D, taken along the line 5D-5D of FIG. 4D.

In some embodiments, the first article 116 formed on the manufacturing device 4103 may be substantially hollow. For example, as shown in the cross section of FIG. 5D, the first article 116 may include an outer wall 4118 that extends about a cavity 4120 of the article 116. In other words, an inner surface 4119 of the outer wall 4118 defines the cavity 4120. The longitudinal cross section of the cavity 4120 is shown in phantom in FIG. 4D. The outer wall 4118 may be substantially consistent throughout the article 116. In some embodiments, the thickness 4122 of the outer wall 4118 may be between approximately 0.003 inches and 1/32 inches in some embodiments. Also, in some embodiments, the outer wall 4118 may extend continuously about the first article 116, forming a substantially complete enclosure in all directions.

In some embodiments, the outer wall 4118 includes particles 110 that are bound by the binder 4105 (e.g., FIG. 6C), and the cavity 4120 may contain loose particles 110 that are detached and unbound. Stated differently, the outer wall 4118 may surround and at least partially encapsulate the loose particles 110 within the cavity 4120. The loose particles 110 may be encapsulated as the outer wall 4118 is formed around those loose particles 110.

The rapid manufacturing devices 101 of FIGS. 4A, 4B, 4C, and 4D may be configured for forming the article 110 with metal particles 110 bound together by the binder 105 (i.e., without sintering the particles 110 together). Accordingly, the rapid manufacture of the article may be achieved in an energy-efficient manner. However, it will be appreciated that other rapid manufacturing methods may be employed without departing from the scope of the present disclosure. For example, the rapid manufacturing device 101 may be configured for sintering the particles 110 together by selectively melting and fusing particles 110 together to form the first article.

Figure 7:
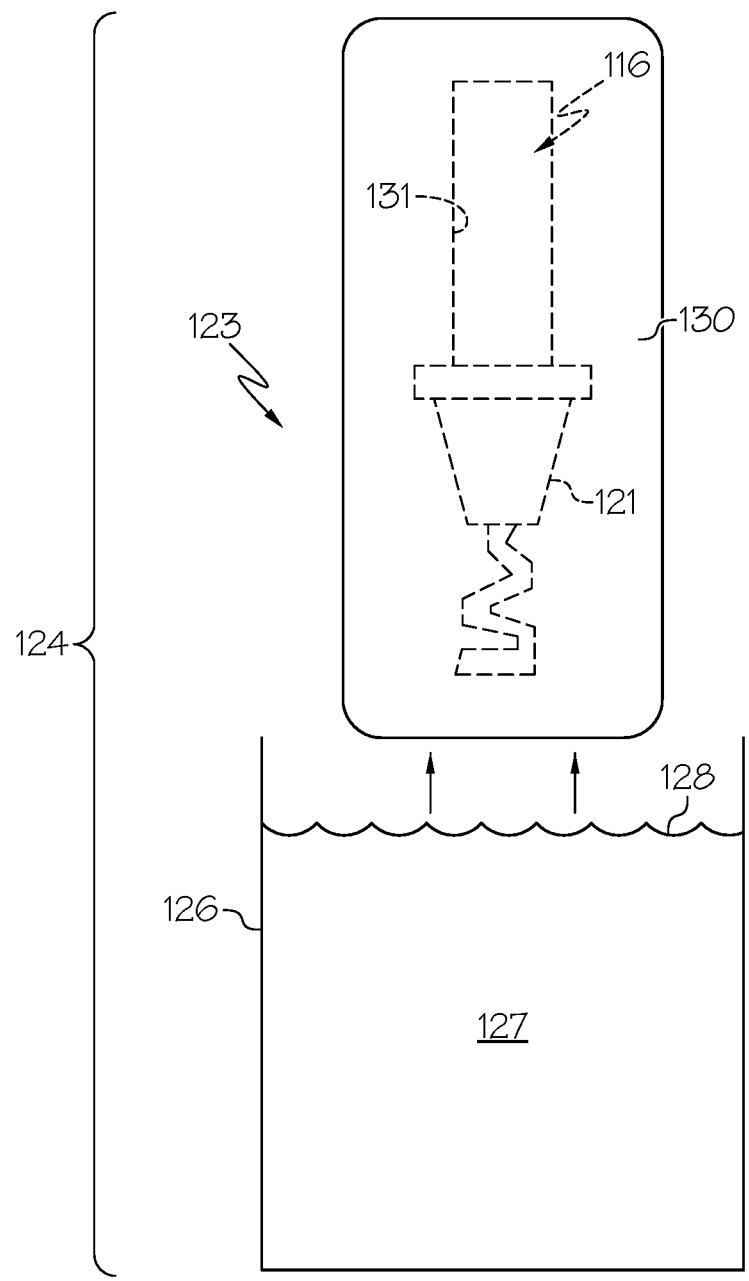
FIG. 7 is a schematic side view of an encasement device, which is part of the manufacturing system of FIG. 2, and which is used in the manufacturing method of FIG. 3.

Referring back to FIG. 3, the method 1000 may continue to 1004, wherein the first article 116 (formed at 1002) is encased by an outer member 130. This is represented in FIG. 7.

Specifically, the first article 116 may be transported to a container 126. The container 126 may contain a slurry 128 of outer member material 127. The outer member material 127 is a ceramic material in some embodiments. The outer member material 127 may be, for example, silica, alumina, zircon, cobalt, mullite, kaolin, and mixtures thereof. The outer member material 127 generally has a melting point that is greater than the melting point of the particles 110.

The first article 116 may be exposed to the outer member material 127, for example, by dipping the first article 116 into the outer member material 127, by spraying the outer member material 127 onto the first article 116, etc. In some embodiments, a relatively thin coating may be applied to the first article 116 before exposure to the outer member material 127. For example, the first article 116 may be coated with an organic material (e.g., wax or varnish) or with an inert ceramic coating. The article 116 may be exposed to the slurry 128 repeatedly for as many times as necessary to form the outer member 130 with an acceptable thickness. The outer member material 127 may be cured about the first article 116 to form the outer member 130 with solid and rigid properties.

In some embodiments, the outer member 130 may encase an entirety of the first article 116, such that the entire outer surface of the first article 116 is covered by the outer member 130 and an inner wall 131 of an internal cavity 129 substantially conforms (inversely) to a shape of the first article 116. In other embodiments, the outer member 130 may partially encase the first article 116; however, the outer member 130 may encase a majority of the first article 116 in these embodiments. In these latter embodiments, the outer member 130 may be formed such that a portion of the first article 116 is exposed and/or protrudes from the outer member 130. Still further, the outer member 130 may be formed with at least one hole that exposes the first article 116.

Once hardened, the inner wall 131 corresponds to an outer surface 121 of the first article 116. Also, the outer member 130 contains the first article 116 as well as the second group 113 of particles 110 disposed within the first article 116. In other words, an encasement 123 may be formed. It will be appreciated that the encasement 123 includes the outer member 130 and any material contained within the internal cavity 129. Thus, in the embodiment of FIG. 7, the encasement 123 includes the outer member 130, the first article 116, as well as the second group 113 of particles 110 contained within the first article 116.

Figure 8:
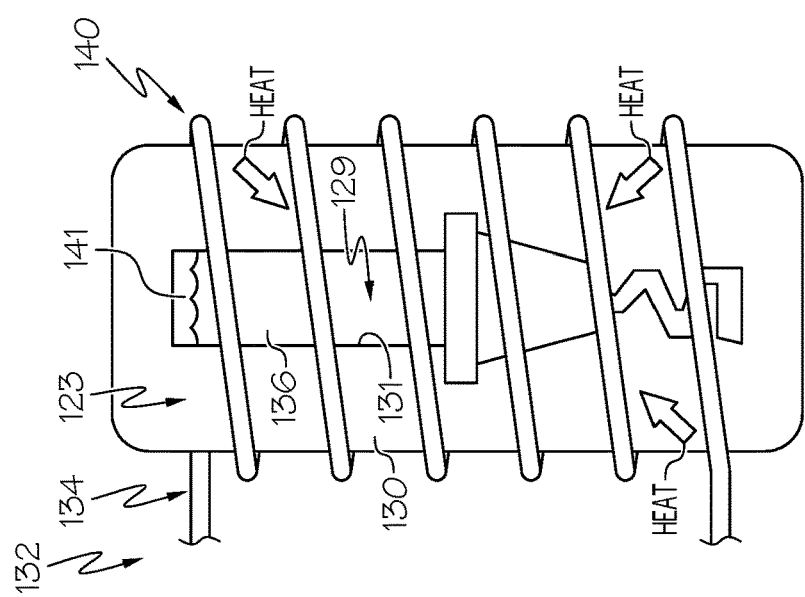
FIG. 8 is a schematic side view of a heating device, which is part of the manufacturing system of FIG. 2, and which is used in the manufacturing method of FIG. 3.

Next, the method 1000 may continue at 1006, wherein the encasement 123 may be transported to the heating/solidification device 132 represented in FIG. 8. In some embodiments, the heating/solidification device 132 may include a heating device 134. The heating element 140 is represented in FIG. 8 (and in FIG. 9) as extending helically about and surrounding the outer member 130. The heating element 140 may be an electrically resistive element that provides heat to the encasement 123 in some embodiments. Also, the heating element 140 may provide radiant heat, inductive heating, or another type. During operation, the heating element 140 may provide heat to the outer member 130 as well as the material therein. In some embodiments, the binder 105 (if present) may be removed from the first article 116. For example, the heating device 132 may be used in a "binder burn-out" process by heating the encasement 123 in a predetermined environment for a predetermined time sufficient to remove the binder 105 from the encasement 123. In some embodiments, the encasement 123 may be heated for approximately one hour in an ambient air environment set between approximately 400° C. to 600° C. to remove the binder 105. Then, the heating device 134 may heat the encasement 123 to melt the remaining particles 110 disposed within the internal cavity 129, turning this material molten and flowable while the outer member 130 remains solid. Specifically, the particles 110 may melt together to form a molten mass 136. The molten mass 136 may be contained by the inner wall 131 of the outer member 130.

In some embodiments, the volume of the molten mass 136 may be less than the volume of the internal cavity 129. Thus, the molten mass 136 may collect and cause a pocket 141 to form within the cavity 129 as shown in FIG. 8. It will be appreciated that the material of the first article 116 may thermally expand as it melts into the molten mass 136. Therefore, the density and porosity of the first article 116 (described in detail above) may allow the material to thermally expand within the internal cavity 129 without damaging the outer member 130. In other words, there is enough room within the cavity 129 for the material to melt and thermally expand without damaging the outer member 130 because of the density and porosity characteristics of the first article 116.

Figure 9:
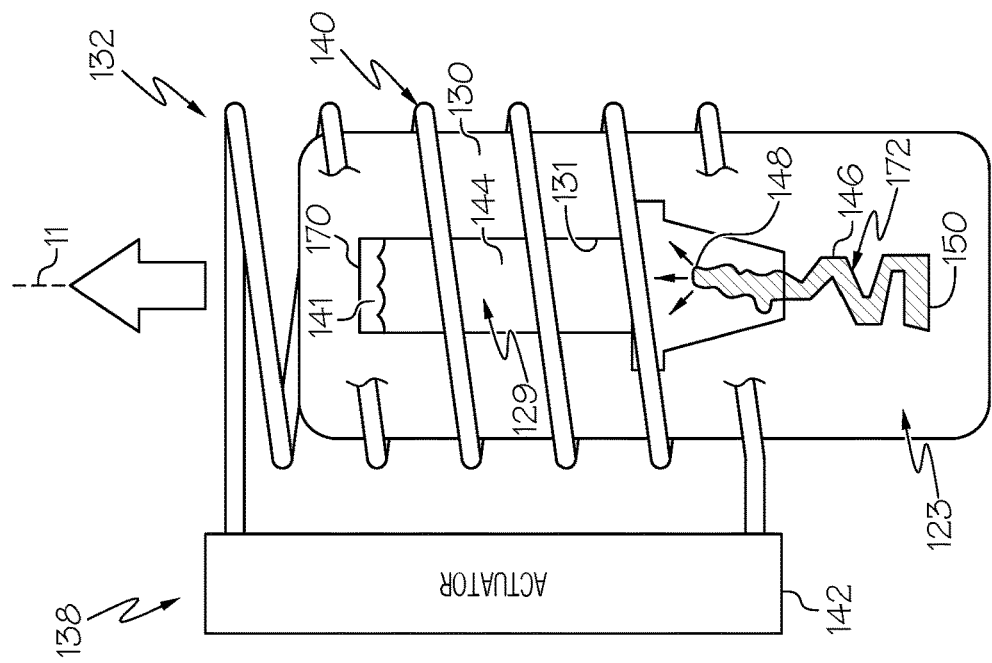
FIG. 9 is a schematic side view of a solidification device, which is part of the manufacturing system of FIG. 2, and which is used in the manufacturing method of FIG. 3.

Next, the method 1000 may continue to 1008 wherein the molten mass 136 is solidified. In some embodiments, the molten mass 136 may be directionally solidified (e.g., using a zone refinement processes) as represented in FIG. 9. In some embodiments, the heating element 140 may be used, in part, as a solidification device 138 for directionally solidifying the molten mass 136. The solidification device 138 may also include an actuator 142, which is operatively connected to the heating element 140. The actuator 142 may be a hydraulic actuator in some embodiments. Also, the actuator 142 may be a linear actuator in some embodiments. The actuator 142 may be configured to move the heating element 140 relative to the encasement 123. The actuator 142 may also be configured to move the encasement 123 relative to the heating element 140 in some embodiments. Specifically, as shown in the FIG. 9, the actuator 142 may move the heating element 140 relative to one end of the encasement 123, causing the molten mass 136 adjacent a sprue end 150 of the cavity 129 to cool initially. Accordingly, a zone of solidified material 146 forms. Additionally, in some embodiments, the process may include using a starter seed or grain selector to enable a single crystal to form. It will be appreciated that the leading edge 148 may be a barrier between the solidified material 146 and a remaining molten portion 144 of the molten mass 136.

The zone of solidified material 146 may grow and the leading edge 148 may proceed through the cavity 129, generally along the longitudinal axis 11 toward an opposing end 170 of the cavity 129. Also, the zone of solidified material 146 may grow until the molten mass 136 is fully solidified within the internal cavity 129. Once solidified, the material forms a second article 172 that corresponds substantially to the surface of the inner wall 131 of the internal cavity 129. It will be appreciated, however, that the pocket 141 may remain within the internal cavity 129.

Directionally solidifying the molten mass 136 in the outer member 130 may form the second article 172 as both of a single crystal structure and of substantially the same shape as the first article 116. Additionally, the second article 172 may densify and may be substantially free of voids, contaminates, or other defects. For example, when directionally solidifying the second article 172 using a starter seed or grain selector, contaminates in the molten mass 136 may be pushed, or collected, by the leading edge 148 into a slag end or other common area of the second article 172, which may then be removed and scrapped.

Figure 10:
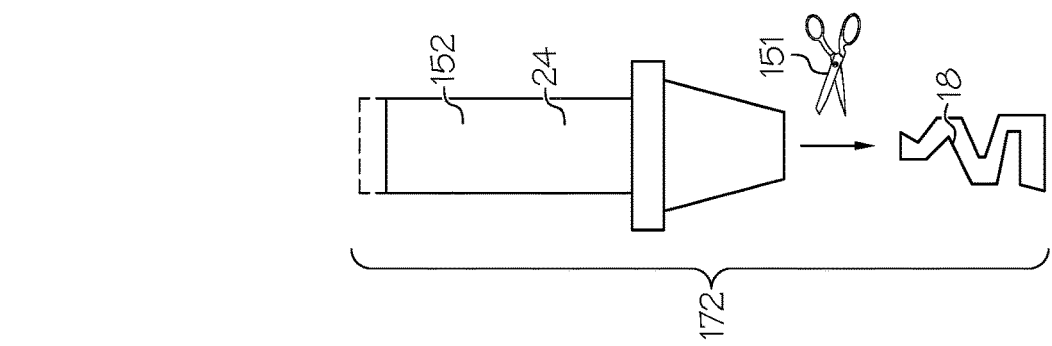
FIG. 10 is a schematic side view of a post-solidification device, which is part of the manufacturing system of FIG. 2, and which is used in the manufacturing method of FIG. 3.

Finally, with reference to FIGS. 3 and 10, the method 1000 may continue to 1010, wherein post-processing of the second article 172 occurs. The second article 172 may be removed from the outer member 130 (e.g., by breaking the outer member 130 or otherwise removing the second article 172 from the outer member 130). Then, in some embodiments, the post-solidification device 151 may be used to remove the first body portion 18 (i.e., the trim portion) of the second article 172 from the second body portion 24. Other post-processing may be performed, such as other cutting operations, polishing operations, and more.

It will be appreciated that the method 1000 and system 100 of the present disclosure increases manufacturing efficiency. A part (e.g., the part 10 of FIG. 1A, the part 10' of FIG. 1B, and/or the second article 172 of FIG. 10) may be formed that may have relatively complex features (e.g., three-dimensionally curved outer surfaces, etc.). Also, the part may have single crystal grain structure. Accordingly, the part may be included in a gas-turbine engine, and its single crystal grain structure may increase efficiency and/or increase the operating life of the engine. Additionally, the part may be formed relatively quickly using the method 1000 and system 100 of the present disclosure. Furthermore, the parts may be formed in an energy efficient manner.

Figure 11:
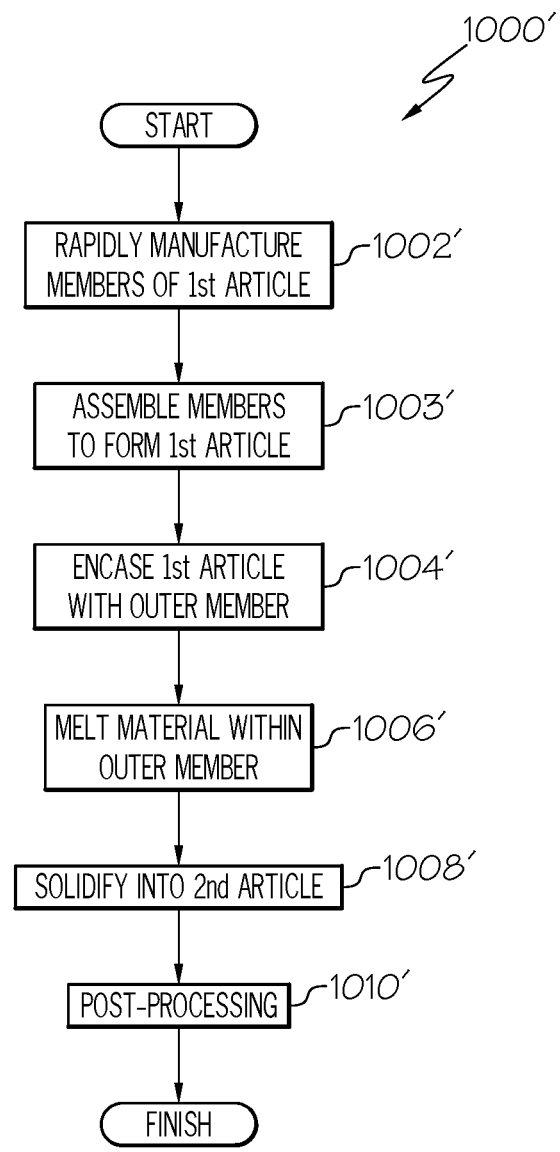
FIG. 11 is a flowchart illustrating the method of the present disclosure according to additional embodiments.

Referring now to FIG. 11 the method 1000' of manufacturing will be discussed according to additional embodiments of the present disclosure. It will be appreciated that the method 1000' may be substantially similar to the method 1000 discussed above with respect to FIG. 3 except as discussed. Thus, for the sake of brevity, features of the method 1000' that are common to the method 1000 will not be repeated.

The method 1000' may begin at 1002', wherein a plurality of members of the first article 116' are rapidly manufactured. In some embodiments of 1002', the members may be additively manufactured like the embodiments of FIG. 4A or 4D. Then, at 1003' the members may be assembled together to form the article 116'.

Figure 12B:
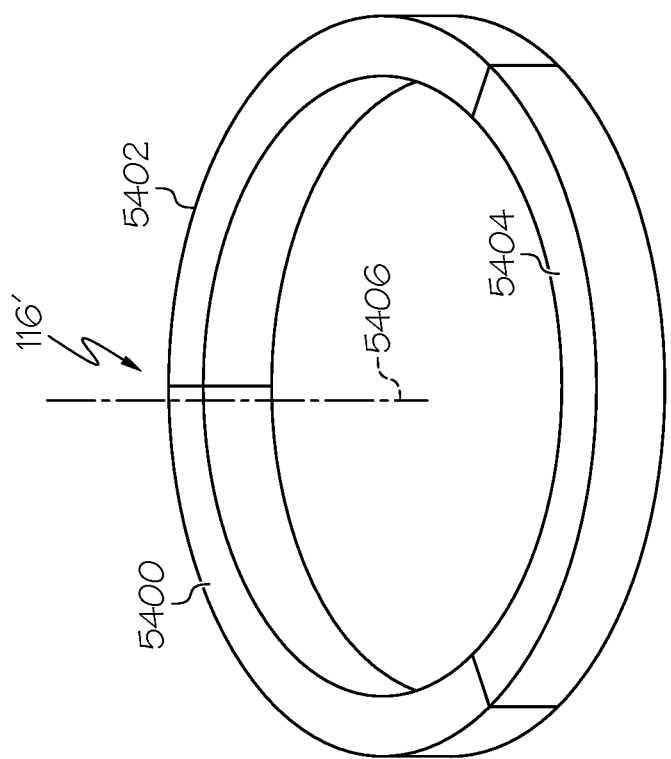

As shown in FIG. 12A, a first frustoconic member 5200 and a second frustoconic member 5202 may be formed using the rapid manufacturing device 101 of the present disclosure. Then, the members 5200, 5202 may be attached face to face. For example, the members 5200, 5202 may be adhesively attached to form an annular first article 116' that is centered on an axis 5204. In another embodiment represented in FIG. 12B, a first arcuate member 5400, a second arcuate member 5402, and a third arcuate member 5404 may be attached end to end. The members 5400, 5402, 5404 may be attached to form an annular first article 116' that is centered on an axis 5406.

Subsequently, the method 1000' may proceed as described above. Specifically, at 1004' the assembled first article 116' may be encased with the outer member 130. Then, at 1006' the material within the outer member 130 may be melted into the molten mass 136. Next, at 1008' the molten mass 136 may be directionally solidified into the second article 172. Finally, post-processing may be performed at 1010' of the method 1000'.

Figure 12B:
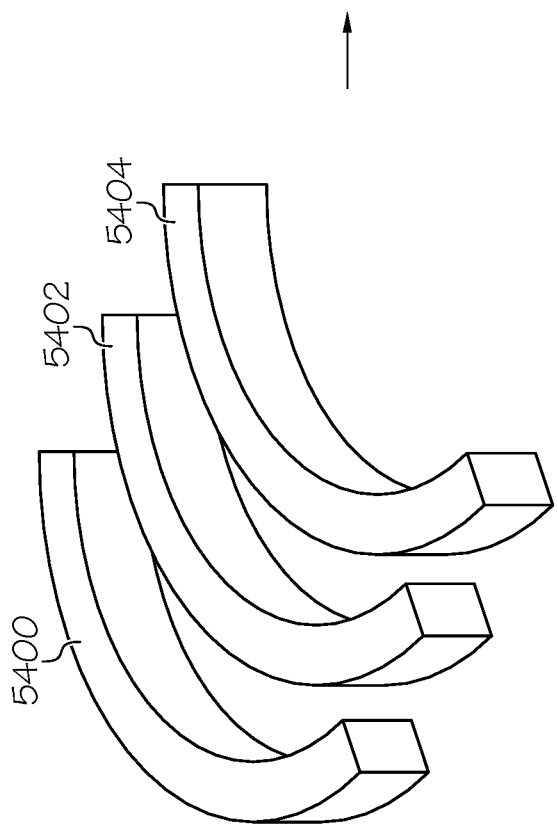

It will be appreciated that the method 1000' may provide certain benefits. For example, the different members may be additively manufactured simultaneously on separate rapid manufacturing devices. This may reduce overall manufacturing time as compared to embodiments in which the first article is additively manufactured as a unitary, one-piece body. Also, by forming the first article from assembled members, it may be easier to form complex features (e.g., complex, three-dimensional curved surfaces, pockets, etc.) on the first article. For example, as shown in FIG. 12A, the first article 116' may have an overhanging edge 5205 (e.g., areas that are angled more than 45 degrees from the axis 5204). By additively manufacturing the members 5200, 5202 in the orientation shown, flipping one over, and attaching them face to face, the overhanging edge 5205 may be formed accurately. Also, if the first article 116' is too large to be formed as a unitary part, then as shown in FIG. 12, the arcuate members 5400, 5402, 5404 may be formed and then attached as shown to form the larger first article 116'.

Figure 13:
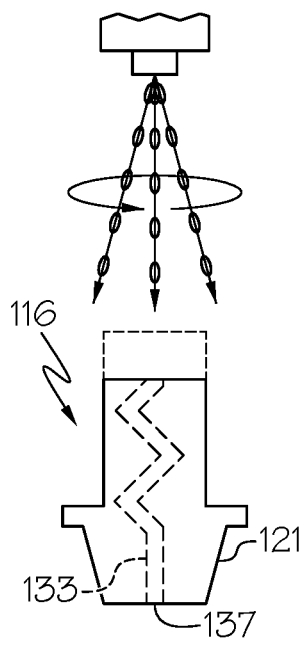
FIGS. 13-17 are schematic views of methods of forming a part with an internal aperture according to example embodiments of the present disclosure.

Referring now to FIGS. 13-17, manufacturing methods of the present disclosure will be discussed according to additional embodiments. As shown in FIG. 13, the first article 116 may be formed in an additive manufacturing process (e.g., those represented in FIGS. 4A and 4D). The first article 116 may be formed to include an exterior surface 121 and a first internal aperture 133.

The first internal aperture 133 may comprise a passage that extends through the first article 116. As shown in FIG. 14, the first article 116 may be constructed such that the internal aperture 133 includes a first port 137 and a second port 139.

Figure 14A:
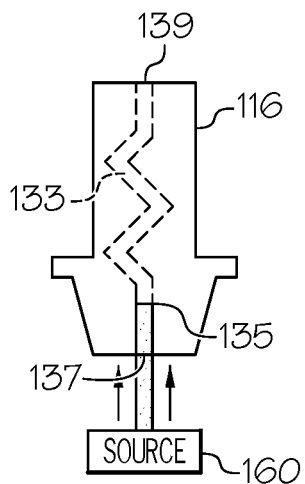
Figure 14C:
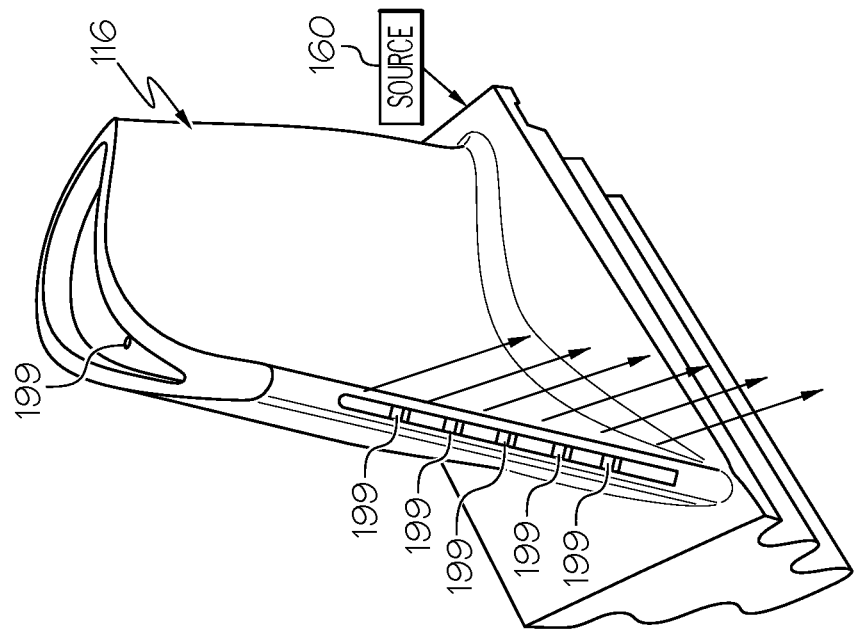
Figure 14B:
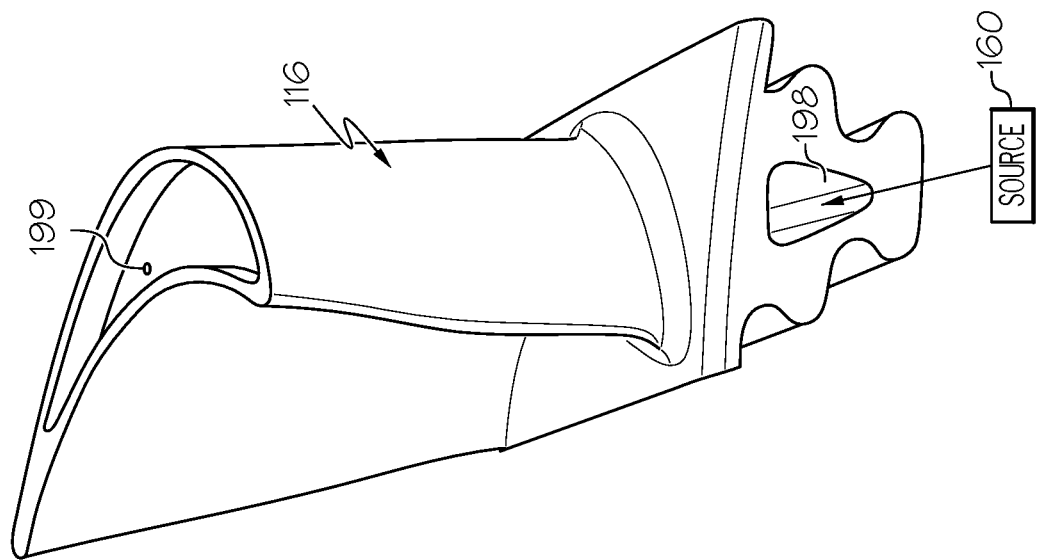

Then, as shown in FIG. 14A, a core material 135 may be provided into the internal aperture 114. For example, the core material 135 may be substantially the same as the material 127 described above with respect to FIG. 7. The core material 135, therefore, may include a ceramic material. As shown in FIG. 14, the core material 135 may be pressurized (e.g., through positive pressure) from a tank or other source 160 and introduced into the internal aperture 133 via the first port 137. Thus, the core material 135 may flow from away from the first port 137 toward the second port 139 and substantially fill the internal aperture 133. FIGS. 14B and 14C represent another embodiment, in which the first article 116 is shaped substantially like an airfoil, similar to FIG. 1B.

Also, as shown in FIGS. 14B and 14C, the internal aperture 133 may be a passage that extends through the first article 116, from at least one inlet 198 to at least one outlet 199. As shown, the core material 135 may be provided via the inlet 198, and the core material 135 may flow toward the outlet 199 to substantially fill the aperture 133. This core material 135 may convert and solidify while inside the aperture 133. A solid core 197 (represented in FIG. 15) may be formed that corresponds (inversely) to the internal surfaces of the aperture 133.

In additional embodiments, the solid core 197 may be formed initially. Then, a first and second member may be formed separately (e.g., similar to FIGS. 12A and 12B) and assembled around the solid core 197.

Figure 15:
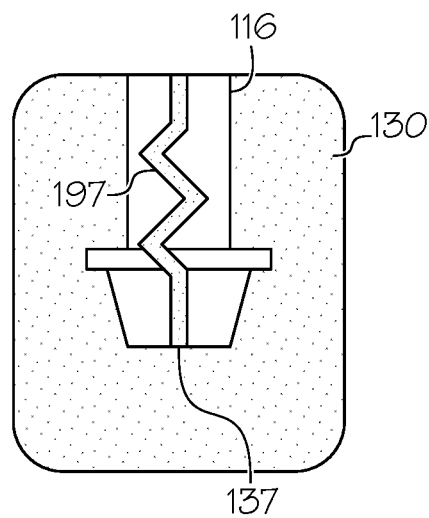

Subsequently, as shown in FIG. 15, the outer member 130 may be formed about the first article 116 as discussed above, except that the core material 135 and/or the solid core 197 may be included within the internal aperture 133 as the outer member 130 is formed. In some embodiments, the core material 135 may solidify within the internal aperture 133 before the first article 116 is exposed to the slurry and/or before the outer member 130 is formed. In other embodiments, the core material 135 may solidify as the outer member 130 simultaneously solidifies. In some embodiments, the outer member 130 and the solid core 197 may integrally connect proximate the first port 137 and form a unitary, one-piece casting mold.

Figure 16:
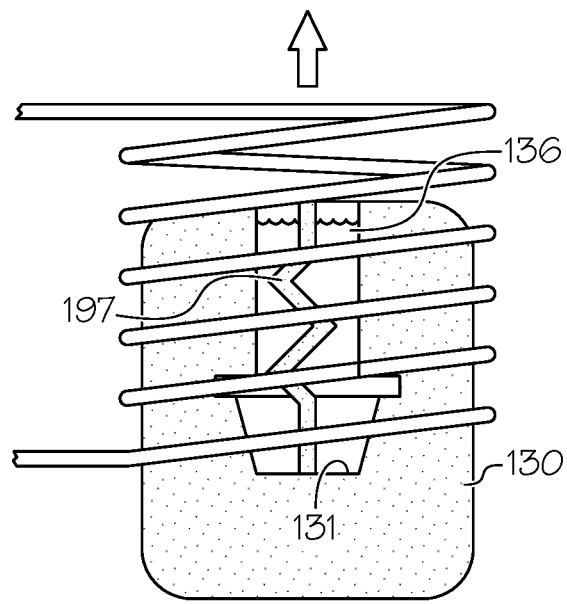
Figure 17:
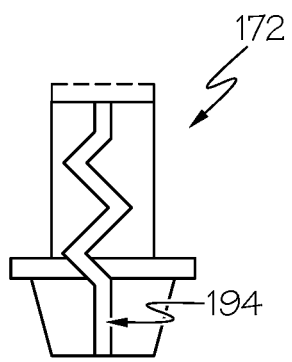

Next, as shown in FIG. 16, the outer member 130, the first article 116, and the solid core 197 may be heated, similar to the embodiments discussed above with respect to FIG. 8. This may melt the material of the first article 116 and form the molten mass 136 within the inner walls 131 of the outer member 130 and around the solid core 197. Then, the molten mass 136 may be re-solidified, similar to the embodiments of FIG. 9. A second article 172 may be formed from the re-solidified part that includes a second internal aperture 194 corresponding to the solid core 197.

Finally, the outer member 130 and the solid core 197 may be removed from the second article 172. The outer member 130 may be fractured and the solid core 197 may be chemically leached from the second internal aperture 194. Then, the part may be finished, for example by cutting off slag or other portions, by polishing the part, etc.

In some embodiments, the second internal aperture 194 may be configured as a cooling fluid flow passage. For example, when operating in the gas turbine engine (FIG. 1B), the second internal aperture 194 may accept a flow of cooling fluid (air) into the inlet 198, and that fluid may flow through the aperture 194 and out the outlet 199 to cool the part.

Thus, the method of creating internal apertures 194 of FIGS. 13-17 may provide significant cost savings and time savings. The internal apertures 194 may be formed accurately and in an efficient manner.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A method of manufacturing a part comprising:
providing a material that includes a plurality of particles and a binder that is uncured, the particles being metallic;
forming a first article from the material including curing the binder to bind a first collection of the particles together into an outer wall of the first article that defines a cavity of the first article, including containing a second collection of the particles that are detached and unbound within the cavity, the first collection of particles remaining solid during formation of the first article;
exposing the formed first article to a slurry of outer member material, and curing the outer member material about the formed first article to encase at least a portion of the formed first article with an outer member, the outer member being rigid and having a melting point greater than that of the particles, the outer member defining an internal cavity that corresponds to the first article;
heating the outer member and the first article to melt the first collection and the second collection of particles into a molten mass within the internal cavity of the outer member as the outer member holds the form of the molten mass to correspond to the first article; and
solidifying the molten mass within the outer member to form a second article, the second article corresponding to at least a portion of the internal cavity of the outer member.

2. The method of claim 1, wherein forming the first article includes selectively distributing the binder amongst the plurality of particles according to a predetermined shape of the first article.

3. The method of claim 1, wherein forming the first article includes selectively curing the binder according to a predetermined shape of the first article.

4. The method of claim 1, further comprising applying a compression load to the material for forming the first article.

5. The method of claim 1, wherein forming the first article includes providing the material within a mold cavity and binding the first collection of the particles within the mold cavity.

6. The method of claim 1, wherein solidifying the molten mass includes solidifying the molten mass along a predetermined solidification path within the outer member to form the second article.

7. The method of claim 6, wherein solidifying the molten mass includes directionally solidifying the molten mass to have a single-crystal structure.

8. The method of claim 1, wherein forming the first article includes forming the first article to include a first portion and a second portion;
wherein encasing the at least a portion of the first article includes defining the internal cavity to include a first volume that substantially corresponds to the first portion of the first article and a second volume that substantially corresponds to the second portion of the first article;
wherein solidifying the molten mass includes forming the second article to include a body portion that substantially corresponds to the first volume and a trim portion that substantially corresponds to the second volume; and further comprising removing the trim portion from the body portion after solidifying the molten mass.

9. The method of claim 1, wherein forming the first article includes forming a first member of the first article and forming a second member of the first article; and further comprising assembling the first member and second member to form the first article before encasing the at least a portion of the first article with the outer member.

10. The method of claim 1, wherein forming the first article includes forming a first internal aperture within the first article;

further comprising providing a solid core within the first internal aperture;

wherein heating the outer member and the first article includes heating the outer member, the first article, and the solid core; and wherein solidifying the molten mass includes solidifying the molten mass within the outer member and about the solid core to form the second article, an outer surface of the second article corresponding to the at least a portion of the internal cavity of the outer member, the second article including a second internal aperture corresponding to the solid core.

11. The method of claim 10, further comprising providing a flowing core material into the first internal aperture and converting the flowing core material into the solid core within the first internal aperture.

12. The method of claim 1, wherein the particles are chosen from a group consisting of MAR-M247 and Haynes 230.

13. A method of manufacturing a part comprising:

providing a material that includes a plurality of particles and a binder that is uncured, the particles being metallic;

forming a first article from the material, including curing the binder to bind a first collection of the plurality of particles together into an outer wall of the first article that defines a cavity of the first article, including containing a second collection of the particles that are detached and unbound within the cavity, the first collection of particles remaining solid during formation of the first article, the first article defining an exterior and defining a first internal aperture;

providing a flowing core material within the first internal aperture;

converting the flowing core material to a solid core within the first internal aperture;

exposing the formed first article to a slurry of outer member material, and curing the outer member material about the formed first article to encase the first article with an outer member while the solid core is within the first internal aperture, the outer member being rigid and having a melting point greater than that of the particles, the outer member defining an internal cavity surface that corresponds to at least part of the exterior of the first article;

heating the outer member, the first article, and the solid core to melt the first collection and the second collection of particles of the first article into a molten mass within the internal cavity of the outer member as the outer member holds the form of the molten mass to correspond to the first article and the solid core holds the form of the first internal aperture; and re-solidifying the molten mass within the outer member and about the solid core to form a second article, an outer surface of the second article corresponding to the internal cavity surface of the outer member, the second article including a second internal aperture corresponding to the solid core.

14. The method of claim 13, wherein the first internal aperture is a flow passage with an inlet and an outlet;

wherein providing the flowing core material includes providing the flowing core material within the flow passage by applying pressure to the flowing core material and flowing the core material away from one of the inlet and the outlet and toward the other of the inlet and the outlet.

15. The method of claim 14, further comprising attaching the outer member to the solid core.

16. The method of claim 15, wherein attaching the outer member to the solid core includes integrally attaching the solid core and the outer member to be unitary and monolithic.

17. The method of claim 13, wherein forming the first article includes forming a first member of the first article and forming a second member of the first article; and further comprising assembling the first member and second member to form the first article before encasing the first article with the outer member.

18. The method of claim 13, wherein re-solidifying the molten mass includes forming a substantially single grain structure within the second article.

* * * * *